United States Patent
Liu et al.

(10) Patent No.: US 9,797,036 B2
(45) Date of Patent: Oct. 24, 2017

(54) METHOD OF MAKING CORROSION RESISTANT AND GLOSSY APPEARANCE COATING FOR LIGHT METAL WORKPIECE

(71) Applicant: GM Global Technology Operations LLC, Detroit, MI (US)

(72) Inventors: Ming Liu, Shanghai (CN); Lei Gao, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 287 days.

(21) Appl. No.: 14/670,819

(22) Filed: Mar. 27, 2015

(65) Prior Publication Data

US 2015/0284836 A1    Oct. 8, 2015

Related U.S. Application Data

(63) Continuation of application No. PCT/CN2014/074878, filed on Apr. 8, 2014.

(30) Foreign Application Priority Data

Nov. 20, 2014  (CN) .......................... 2014 1 0666394

(51) Int. Cl.
    *B32B 3/00*  (2006.01)
    *C23C 8/80*  (2006.01)
    (Continued)

(52) U.S. Cl.
    CPC .................. *C23C 8/80* (2013.01); *B60B 3/10* (2013.01); *C23C 8/04* (2013.01); *C23C 8/36* (2013.01);
    (Continued)

(58) Field of Classification Search
    CPC ....... C25D 11/026; C25D 11/04; C25D 11/26; C25D 11/30; C25D 11/005; C25D 13/14;
    (Continued)

(56) References Cited

U.S. PATENT DOCUMENTS 3,293,158 A    12/1966  McNeill et al.
4,770,946 A     9/1988  Yamauchi et al.
(Continued)

FOREIGN PATENT DOCUMENTS

CN      1369577 A     9/2002
CN    101067204 A    11/2007
(Continued)

OTHER PUBLICATIONS

Kuljian and Elzly Technology Corp. Assessing the Need for 50% Relative Humidity During Tank Painting, National Shipbuilding Research program Sep. 2009.

(Continued)

*Primary Examiner* — Elizabeth Mulvaney
(74) *Attorney, Agent, or Firm* — Harness, Dickey & Pierce, P.L.C.

(57) ABSTRACT

A metal workpiece, such as a wheel, and a method of providing an enhanced corrosion resistant surface coating on an exposed surface of a metal or alloy substrate (such as magnesium). A corrosion resistance basecoat is formed, including generating an oxide layer, and applying a first primer coating onto at least a portion of the oxide layer. The method may further include identifying highest corrosion prone areas on the substrate and designing a support rack that avoids contact with these corrosion prone areas. The method also includes forming a topcoat over at least a portion of the basecoat, by applying a second primer coating onto at least a portion of the first primer coating and depositing a sputtered metallic film onto the second primer coating using a physical vapor deposition technique. A clear coat layer may be applied over the metallic film.

15 Claims, 7 Drawing Sheets

(51) Int. Cl.
| | |
|---|---|
| *B60B 3/10* | (2006.01) |
| *C23C 8/04* | (2006.01) |
| *C23C 8/36* | (2006.01) |
| *C23C 14/08* | (2006.01) |
| *C23C 14/34* | (2006.01) |
| *C23C 28/00* | (2006.01) |
| *C25D 11/30* | (2006.01) |
| *C25D 13/14* | (2006.01) |
| *C23C 8/40* | (2006.01) |
| *C25D 7/00* | (2006.01) |
| *C25D 11/02* | (2006.01) |
| *C25D 11/20* | (2006.01) |
| *C25D 11/24* | (2006.01) |
| *C25D 11/26* | (2006.01) |
| *C25D 17/00* | (2006.01) |
| *C25D 17/06* | (2006.01) |
| *C25D 11/00* | (2006.01) |
| *C25D 13/22* | (2006.01) |

(52) U.S. Cl.
CPC .............. *C23C 8/40* (2013.01); *C23C 14/081* (2013.01); *C23C 14/34* (2013.01); *C23C 28/32* (2013.01); *C23C 28/345* (2013.01); *C25D 7/00* (2013.01); *C25D 11/005* (2013.01); *C25D 11/026* (2013.01); *C25D 11/20* (2013.01); *C25D 11/246* (2013.01); *C25D 11/26* (2013.01); *C25D 11/30* (2013.01); *C25D 13/14* (2013.01); *C25D 17/005* (2013.01); *C25D 17/06* (2013.01); *B60B 2310/616* (2013.01); *B60B 2310/618* (2013.01); *B60B 2310/621* (2013.01); *B60B 2310/654* (2013.01); *B60B 2310/656* (2013.01); *B60B 2310/661* (2013.01); *B60B 2360/106* (2013.01); *B60B 2900/141* (2013.01); *C25D 13/22* (2013.01); *Y10T 428/21* (2015.01); *Y10T 428/24967* (2015.01)

(58) Field of Classification Search
CPC ........... C23C 8/02; C23C 8/10; C23C 28/345; Y10T 428/24997; Y10T 428/24917
See application file for complete search history.

(56) References Cited

U.S. PATENT DOCUMENTS

| | | | |
|---|---|---|---|
| 5,792,335 A | 8/1998 | Barton | |
| 6,103,381 A * | 8/2000 | Mokerji | B32B 5/26 428/412 |
| 6,277,917 B1 | 8/2001 | Jurgetz et al. | |
| 6,365,028 B1 | 4/2002 | Shatrov | |
| 6,399,152 B1 | 6/2002 | Goodrich | |
| 6,896,785 B2 | 5/2005 | Shatrov et al. | |
| 6,896,970 B2 | 5/2005 | Mayzel | |
| 7,713,618 B2 | 5/2010 | Bharadwaj et al. | |
| 9,234,525 B2 | 1/2016 | Voong et al. | |
| 2005/0175785 A1 | 8/2005 | Hentsch et al. | |
| 2006/0062908 A1 | 3/2006 | Ohkoshi et al. | |
| 2007/0161743 A1 | 7/2007 | Frese et al. | |
| 2008/0156638 A1 | 7/2008 | Huang | |
| 2008/0309151 A1 | 12/2008 | Kleber et al. | |
| 2009/0252986 A1 | 10/2009 | Owen et al. | |
| 2009/0321210 A1 | 12/2009 | Tung et al. | |
| 2010/0075172 A1 | 3/2010 | Koch et al. | |
| 2011/0062036 A1 | 3/2011 | Xie et al. | |
| 2011/0064941 A1 | 3/2011 | Sachdev et al. | |
| 2011/0089749 A1 | 4/2011 | Kleber et al. | |
| 2012/0031765 A1 * | 2/2012 | Curran | B05D 3/142 205/50 |
| 2012/0160694 A1 | 6/2012 | Wolters et al. | |
| 2015/0284835 A1 | 10/2015 | Ge et al. | |
| 2015/0284836 A1 | 10/2015 | Liu et al. | |

FOREIGN PATENT DOCUMENTS

| | | |
|---|---|---|
| CN | 101210335 A | 7/2008 |
| CN | 101370961 A | 2/2009 |
| CN | 100588755 C | 2/2010 |
| CN | 102072193 A | 5/2011 |
| CN | 202106791 U | 1/2012 |
| CN | 102560486 A | 7/2012 |
| CN | 103394454 A | 11/2013 |
| CN | 104975292 A | 10/2015 |
| DE | 102015105139 A1 | 10/2015 |
| WO | WO-2015154214 A1 | 10/2015 |
| WO | WO-2015154215 | 10/2015 |
| WO | WO-2016161559 A1 | 10/2016 |
| WO | WO-2017010969 A1 | 1/2017 |

OTHER PUBLICATIONS

Tiger Drylac® Powder Coatings Essentials vol. 1 (www.maxiforcebollards.com/downloads/716_tiger_essentialsvol1-3-201 <http://www.maxiforcebollards.com/downloads/716_tiger_essentialsvol1-3-201> Opdf) available online Mar. 2010.

International Search Report and Written Opinion of the International Searching Authority dated Jan. 9, 2015 for PCT Application No. PCT/CN2014/074878.

International Search Report and Written Opinion of the International Searching Authority dated Jan. 16, 2015 for PCT Application No. PCT/CN2014/074884.

First Office Action for Chinese Application No. 201410666394.4 dated Apr. 5, 2017 with English language translation; 15 pages.

International Search Report and Written Opinion of the International Searching Authority dated Dec. 21, 2015 for related PCT Application No. PCT/CN2015/075998; 9 pages.

Non-Final Office Action for U.S. Appl. No. 14/681,430 dated Jun. 30, 2016; 24 pages.

* cited by examiner

METHOD OF MAKING CORROSION RESISTANT AND GLOSSY APPEARANCE COATING FOR LIGHT METAL WORKPIECE

CROSS-REFERENCE TO RELATED APPLICATIONS

This application claims the benefit and priority of Chinese Patent Application No. 201410666394.4 filed on Nov. 20, 2014, which itself claims the benefit and priority of International Application No. PCT/CN2014/074878 filed on Apr. 8, 2014. The entire disclosures of the above applications are incorporated herein by reference.

FIELD

The present disclosure relates to coatings and methods of applying surface treatments for increased corrosion resistance of metals and alloys susceptible to corrosion.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present technology.

Alloy road wheels with high magnesium or aluminum content are not uncommon on specialty and racing vehicles. The use of such alloy wheels in less expensive passenger vehicles has, however, been limited to a few production sports cars. By way of example, galvanic corrosion is a design consideration in high magnesium content alloy wheels when mated to steel or cast iron wheel hub and brake components. Frequently, these components may spend much of their service life in damp or wet conditions, unfortunately often with road salts, which accelerates the galvanic corrosion reactions. Various coatings have been applied to light metal workpieces and substrates (e.g., comprising magnesium or aluminum), such as alloy wheels, for increasing corrosion protection, but they have had many drawbacks. For example, workpieces having only thick oxide layers formed thereon have been used, but are often brittle and prone to cracking. Workpieces having powder coating materials directly applied to oxide layers have shown poor adhesion. Workpieces having chemical passivation techniques in combination with an oxide layer have been used, but have had poor chipping resistance. Still further, workpieces simply having an electrocoating layer provided on an oxide layer have also been used, but may yield a product with poor scratch corrosion and poor thermal shock resistance. In yet other alternatives, wheels may be provided as two-component assemblies having inner and outer portions, with the inner portion galvanically isolating the outer portion from the steel or cast iron wheel hub and brake components. However, such two component assemblies may not always be desirable.

Accordingly, there remains a need for improved surface treatments for increased corrosion resistance of light metals and alloys susceptible to corrosion.

SUMMARY

This section provides a general summary of the disclosure, and is not a comprehensive disclosure of its full scope or all of its features.

In various aspects, the present teachings provide a light metal workpiece with enhanced surface protection. The workpiece comprises a metal or alloy matrix, such as magnesium, having an exposed surface with a corrosion resistance basecoat applied onto at least a portion of the exposed surface, and a protective topcoat applied onto at least a portion of the corrosion resistance basecoat. The corrosion resistance basecoat may include a pretreatment layer and a first primer coating applied onto at least a portion of the pretreatment layer. The protective topcoat may include a second primer coating applied onto at least a portion of the first primer coating and a sputtered metallic film applied onto at least a portion of the second primer coating using a physical vapor deposition technique. A clear coat layer may be applied onto at least a portion of the metallic film.

In other aspects, the present teachings provide a magnesium metal wheel comprising a magnesium metal matrix having an exposed surface. A magnesium oxide ceramic layer may be formed on at least a portion of the exposed surface. A first primer coating may be applied onto at least a portion of the magnesium oxide ceramic layer. A second primer coating may be applied onto at least a portion of the first primer coating. A sputtered metallic film may be deposited onto at least a portion of the second primer coating using a physical vapor deposition technique. A clear coat layer may then be applied onto at least a portion of the metallic film. In certain aspects, the sputtered metallic film may be deposited having a thickness of from about 5 nm to about 15 nm. In various aspects, each of the first primer coating and the second primer coating comprises at least one of an electrostatic coating and a powder material coating.

In still other aspects, the present teachings include a method of providing an enhanced surface coating on a metal or alloy substrate. The method comprises providing a metal or alloy substrate having an exposed surface. A corrosion resistance basecoat may be formed onto at least a portion of the exposed surface. The corrosion resistance basecoat may be formed by generating an oxide layer on the exposed surface of the substrate and applying a first primer coating onto the oxide layer. A protective topcoat may be formed onto at least a portion of the corrosion resistance basecoat. The method of forming the protective topcoat may include applying a second primer coating onto at least a portion of the first primer coating and depositing a sputtered metallic film onto the second primer coating using a physical vapor deposition technique. The sputtered metallic film may be deposited having a thickness of from about 5 nm to about 15 nm. The method may further include applying a clear coat layer over at least a portion of the metallic film. In various aspects, each of the first primer coating and the second primer coating comprises at least one of an electrostatic coating and a powder material coating.

In certain other aspects, the method may further include identifying corrosion prone areas of the exposed substrate prior to forming the corrosion resistance basecoat on the exposed surface. The metal or alloy substrate is disposed on a supporting rack member. Thus, the method may include aligning one or more support regions of the supporting rack member with predetermined contact regions of the substrate, where the predetermined contact regions are outside of the corrosion prone areas. Then, the corrosion resistance basecoat may be formed on a portion of the exposed surface. The oxide layer may be generated on the exposed surface of the substrate by immersing the substrate in an electrolyte bath while resting on the support members of the supporting rack member. The supporting rack member may be configured to serve as a conductive electrode, such as a working electrode/cathode.

Further areas of applicability and various methods of enhancing corrosion protection of light metal workpieces and valve metals will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
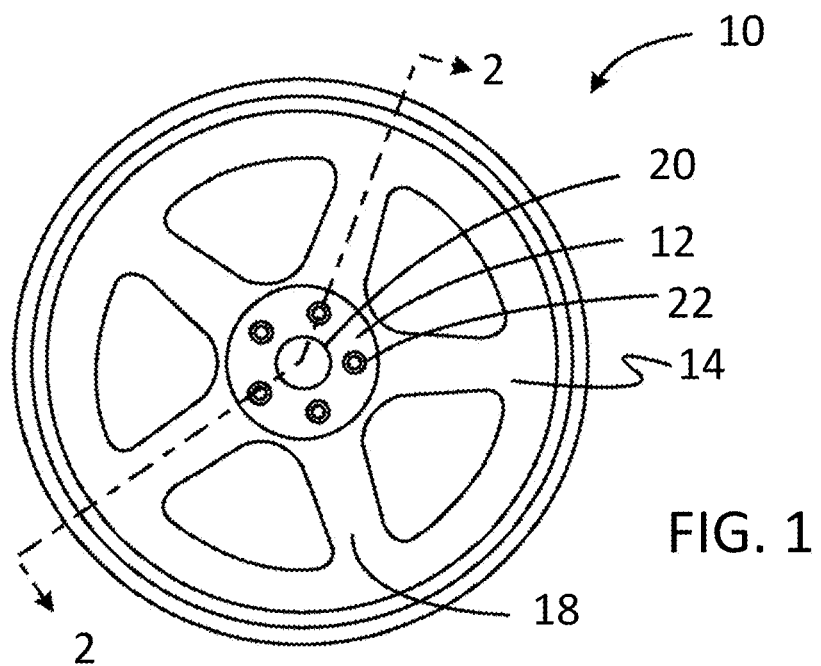
FIG. 1 is a front plan view of an exemplary wheel assembly according to various aspects of the present disclosure.

It should be noted that the figures set forth herein are intended to exemplify the general characteristics of materials, methods, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical "or." It should be understood that steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

Spatially relative terms, such as "inner," "outer," "beneath," "below," "lower," "above," "upper," "on," and their variants, may be used herein for ease of description to describe one element or feature's relationship to another element(s) or feature(s). Spatially relative terms may encompass different orientations of the device in use or operation. As used herein, when a coating, layer, or material is "applied onto," "applied over," "formed on," "deposited on," etc. another substrate or item, the added coating, layer, or material may be applied, formed, deposited on an entirety of the substrate or item, or on at least a portion of the substrate or item.

The broad teachings of the present disclosure can be implemented in a variety of forms. Therefore, while this disclosure includes particular examples, the true scope of the disclosure should not be so limited because other modifications will become apparent to the skilled practitioner upon a study of the specification and the following claims.

The present technology generally relates to enhanced surface coatings for light metal workpieces and valve metals. As used herein, the term "valve metal" is used to refer to a metal or metal alloy that can self-grow nano-porous oxide films. The resultant oxide layer formed on a valve metal may well provide some degree of corrosion protection, as it constitutes a physical barrier between the metal and a corrosive environment. However, it may not be aesthetically pleasing, and may not provide proper corrosion resistance for light metal workpieces, such as wheels.

Example valve metals useful with the present technology include aluminum, magnesium, titanium, zirconium, hafnium, chromium, cobalt, molybdenum, vanadium, tantalum, and mixtures and alloys thereof. As is known in the art, valve metals may exhibit electrical rectifying behavior in an electrolytic cell and, under a given applied current, will sustain a higher potential when anodically charged than when cathodically charged. In certain aspects, a workpiece may comprise a light or valve metal, such as magnesium or aluminum. In certain other aspects, the workpiece comprises magnesium, including alloys and matrix composites thereof. A magnesium matrix composite comprises a matrix of metal (e.g., magnesium or magnesium alloy) with a reinforcement phase or material distributed therein. Suitable reinforcement materials include conventional reinforcing particles, powders, fibers, whiskers, and the like.

In various aspects, the present teachings provide a light metal workpiece, such as a valve metal or metal alloy, with enhanced surface protection. In certain aspects, the light metal workpiece may be a component subjected to exposure to a corrosive environment. For example, the light metal workpiece may be a component of a vehicle, such as an automobile. With reference to FIG. 1, in one aspect of the present disclosure, the light metal workpiece may be a wheel 10. In certain variations, the light metal workpiece wheel 10 may be an aluminum, magnesium, or alloy wheel. It should be understood that the technology of the present disclosure can generally be used with any wheel design, or as noted above, any other workpiece or component envisioned to be made from a valve metal that may have an exposed surface subject to a corrosive environment. For example purposes, the wheel 10 may generally be a unitary member or optionally be provided with a center portion 12 coupled with an outer wheel portion 14, as shown. The outer wheel portion 14 may include a rim 16 and may also include one or more spokes 18 extending from the rim 16 in a generally radial direction toward the center wheel portion 12. The wheel portion 12 may include a center opening 20 suitable for a wheel cap (not shown) and may define one or more lug holes 22 useful for attaching the wheel 10 to a vehicle.

Figure 2:
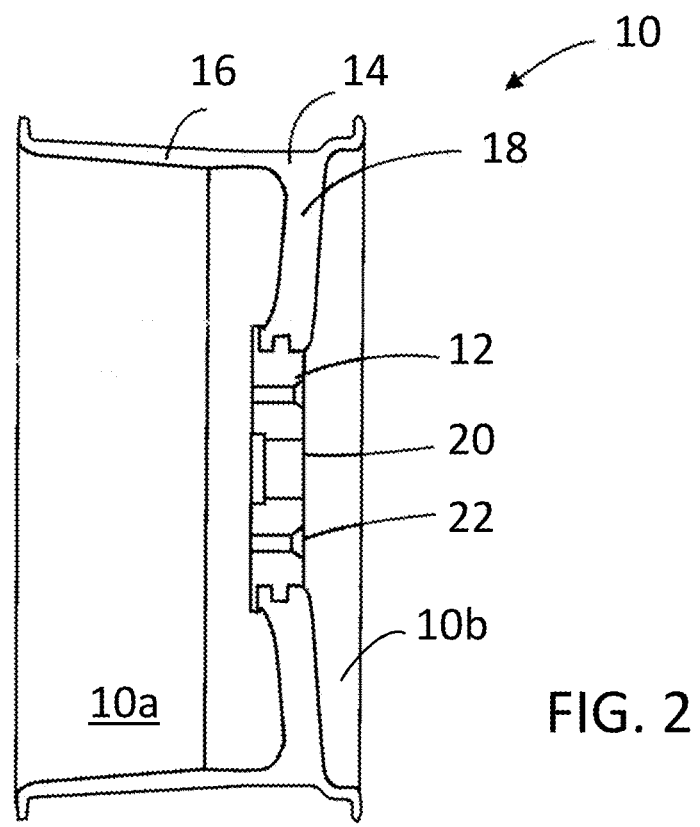
FIG. 2 is a cross-sectional view of the wheel assembly taken along the line 2-2 of FIG. 1.

Referring to FIG. 2, which is cross sectional view of FIG. 1 taken along the line 2-2, the wheel 10 may have an inboard side 10a and an outboard side 10b. The inboard side 10a generally indicates the side of the wheel 10 that faces the vehicle, and the outboard side 10b generally indicates the side of the wheel 10 that faces away from the vehicle and visible when the wheel 10 is attached to the vehicle.

Figure 3:
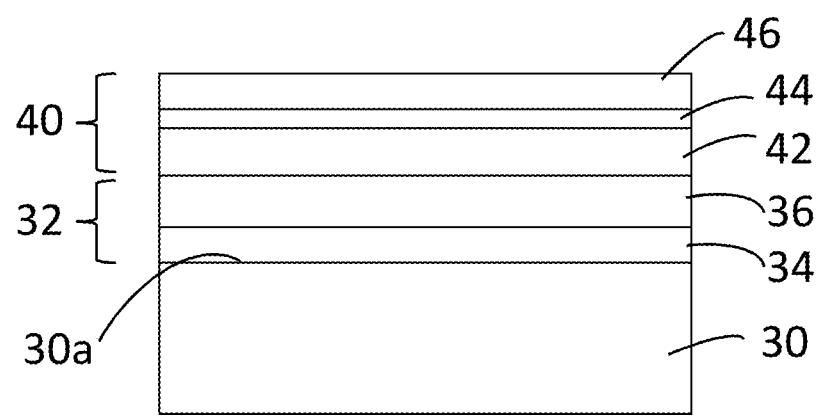
FIG. 3 is a simplified diagram representation illustrating various coatings that can be applied to a metal matrix according to various aspects of the present disclosure.

In various aspects, the wheel 10 or other light metal workpiece comprises a metal or alloy matrix having an exposed surface. FIG. 3 is a simplified diagram representation illustrating various coatings that can be applied to a portion or an entirety of an exposed surface of a metal matrix according to various aspects of the present disclosure. The coatings and treatments discussed herein may be applied to the entire workpiece, or select portions thereof. For example, both the inboard side 10a and the outboard side 10b of a wheel may be subjected to methods of the present teachings that apply enhanced corrosion protection coatings, but it may be desirable to only apply certain coating(s) or layer(s) to the visible outboard side 10b.

Reference number 30 of FIG. 3 generally indicates the material comprising a light metal, such as a metal matrix comprising the light metal, which initially has an exposed surface 30a. The light metal workpiece having the exposed metal surface 30a may undergo various cleaning processes as is known in the art, including degreasing, descaling, neutralization, and similar washing processes. In various aspects, a corrosion resistance basecoat 32 may be applied to the metal or metal matrix, followed by a protective and appearance enhancing topcoat 40. As shown in FIG. 3, a pretreatment layer 34 may be applied or formed on the exposed surface 30a. For example, the pretreatment layer 34 may be a corrosion resistant oxide layer formed on the exposed surface 30a using a micro-arc oxidation or plasma electrolytic technique. A first primer coating 36 may be applied onto the pretreatment layer 34 formed of oxides and may be configured to seal the pretreatment layer 34. As part of the protective topcoat 40, a second primer coating 42 may then be applied onto the first primer coating 36. As will be discussed in more detail below, the first primer coating 36 and the second primer coating 42 may include at least one of an electrostatic coating and a powder material coating. A metallic film 44 may be applied onto the second primer coating 42 to impart a highly reflective, finished look. A clear coat 46 may then be applied over at least a portion the metallic film 44 (for example, the outboard side 10b) as a final protective barrier. As is known in the art, the clear coat 46 may include one or more coatings that impart a desired color/tint, shine, and/or gloss to the workpiece.

As is known in the art, micro-arc oxidation techniques ("MAO"), sometimes also referred to as plasma electrolytic oxidation ("PEO"), spark anodizing, discharge anodizing, or other combinations of these terms, may involve the use of various electrolytes to work in an electrolytic cell and that help generate a porous oxide layer, or porous oxide ceramic layer, at the exposed surface of metal matrix. By way of example, where the workpiece includes aluminum, the oxide layer or oxide ceramic layer may be formed using MAO or PEO techniques to yield a layer of alumina or an alumina ceramic, the composition of which may vary based on the electrolyte and other materials present therein. Where the workpiece includes magnesium, the oxide layer or ceramic oxide layer may be formed using MAO or PEO techniques to yield a layer of magnesia or magnesium oxide ceramic. There are many patented and commercial variants of the MAO and PEO processes, including those described in U.S. Pat. Nos. 3,293,158; 5,792,335; 6,365,028; 6,896,785; and U.S. patent application Ser. No. 13/262,779, published as U.S. Pub. Pat. App. No. 2012/0031765, each of which is incorporated herein by reference in its entirety. In one example, the MAO or PEO process may be performed using a silicate-based electrolyte that may include sodium silicate, potassium hydroxide, and potassium fluoride.

As is generally known in the art, the presence of micropores and/or cracks on the surface of MAO or PEO coatings can be considered to potentially be detrimental and present a weakness with respect to corrosion. The presence of a higher pore density on the surface of the MAO or PEO coatings increases the effective surface area and thus the tendency of a corrosive medium to adsorb and concentrate into these pores. However, the presence of a porous outer layer in MAO or PEO coatings can also serve as an advantage by significantly improving the mechanical interlocking effect, the bonding area, and stress distribution, resulting in higher bond strength. In view of the potential susceptibility to corrosion due to higher effective surface area and porosity, the pore density, distribution of pores and interconnectivity of the pores with the remainder of the substrate can be important factors. In various aspects of the present disclosure, the corrosion resistance basecoat 32 (including pretreatment oxide or ceramic layer 34) may be generated or formed having a controlled and substantially uniform porosity of from about 0.1 µm to about 5 µm, from about 1 µm to about 3 µm, or from about 0.1 µm to about 1 µm. The oxide layer 32 may be generated or formed having a substantially uniform thickness of from about 2 µm to about 30 µm, from about 4 µM to about 25 µm, or from about 5 µm to about 20 µm.

With regard to the above-mentioned potential weakness of the MAO or PEO coatings, a sealing coating is applied to the porous oxide or ceramic layer from the MAO or PEO process. As such, the present disclosure applies a first primer coating 36 over the oxide pretreatment layer 34. In various aspects, the first primer coating 36 may be an electrostatic coating layer, or electrostatic layer, applied onto the oxide pretreatment layer 34 using an electrocoating technique ("e-coating" or electrophoresis coating) that is configured to seal the oxide pretreatment layer 34 and provide for increased adhesion of optional additional layers applied thereon. As an alternative to the e-coating, the first primer coating 36 may include a powder material coating. Prior to the application of the first primer coating 36, the workpiece may optionally be washed or immersed in deionized water.

In aspects where an e-coating is used as the first primer coating 36, it should be understood that there are many sealer systems that may be used in conjunction with the MAO and PEO processes, and they may include a wide variety of polymers and resins, including but not limited to, fluoropolymers, acrylic, epoxy, polyester, polysiloxanes, and polyvinylidene fluoride (PVDF). These materials may be applied in the form of electrostatically sprayed coatings, by electrophoretic deposition, or by known dipping or wet spraying techniques. In one presently preferred aspect that can be used with magnesium workpieces, such as magnesium or magnesium alloy wheels, an epoxy resin may be used, for example, EPOXY RESIN KATAPHORESIS COATING (EED-060M), commercially available from Unires, or its constituent company Tianjin Youli Chemical Co., Ltd. of Tianjin, China. Generally, the first primer coating 36 will not contain a significant amount of any chemically active agent therein. In various aspects, the e-coating treatment process may take place from 0 to about 3 minutes using a voltage of between about 160V to about 220V, and cured at a temperature of from about 160° C. to about 180° C. for a curing time of from about 20 to about 30 minutes. In various aspects, the first primer coating 36 may be an e-coating or powder material coating applied having a substantially uniform thickness of from about 1 µm to about 200 µm, or from about 50 µm to about 150 µm, or from about 70 µm to about 130 µm, or from about 80 µm to about 120 µm, and in certain aspects, a thickness of about 100 µm.

When the first primer coating 36 includes an electrostatically applied coating, the approaches adopted with the present teachings include applying the first primer coating 36 on the oxide pretreatment layer 34 within less than about 30 hours, and preferably less than about 24 hours, less than about 20 hours, or less than about 16 hours after generating or forming the oxide or ceramic oxide pretreatment layer 34.

As mentioned above, the first primer coating 36 may be a powdered coating material. Powder coating materials useful herein as the first primer coating 36 may include thermoplastic or reactive polymers commonly used in the art that are typically solid at room temperature. Most powders are reactive one-component systems that liquefy, flow, and then crosslink as a result of treatment with heat. Common polymers that may be used as powder coating materials include polyester, polyurethane, polyester-epoxy (known as hybrid), straight epoxy (fusion bonded epoxy), and acrylics.

By way of example, in one aspect, the method of applying the powder material coating can include electrostatically spraying a wet black resin powder onto the oxide pretreatment layer of a heated substrate, the resin powder being delivered at a voltage of from about 40 kV to about 50 kV, or about 45 kV, and a current of from about 0.4 A to about 0.6 A, or about 0.5 A. The methods of the present teachings further include curing and condensing any powder coating layer by placing the workpiece or substrate in a heated environment at a temperature of from about 180° C. to about 200° C., or about 190° C., for a time period of from about 15 minutes to about 25 minutes, or about 20 minutes.

As known in the art, a wide range of materials and methods for encapsulation are commercially available that provide for a variety of strategies to create the degree of durability and corrosion resistance. The approaches adopted with the present teachings include applying a protective topcoat 40 that may include applying a second primer coating 42 onto the first primer coating 36. In certain aspects, the entire method may be performed in a single assembly line. In other aspects, the corrosion resistance basecoat layer 32 may be applied in a first assembly, and the protective topcoat 40 may be applied in a second assembly.

In various aspects, the second primer coating 42 may be an e-coating or powder material coating applied having a substantially uniform thickness of from about 1 µm to about 200 µm, or from about 50 µm to about 150 µm, or from about 70 µm to about 130 µm, or from about 80 µm to about 120 µm, or about 100 µm. In certain aspects, the first primer coating 36 can be applied onto the oxide pretreatment layer 34 having a first thickness, and the second primer coating 42 can be applied onto the first primer coating 36 having a second thickness. The first thickness may be substantially equal to or slightly less than the second thickness. The second primer coating 42 may be the same material as the first primer coating 36, or it may be a different material from the first primer coating 36. Both primer coatings may be e-coatings, both primer coatings may be powder coating layers, or one of the primer coatings may be an e-coating, while the other primer coating may be a powder material coating. Further, multiple layers of each coating may be formed. In instances where the first primer coating 36 is an electrocoating and the second primer coating 42 is a powder material coating, it may be beneficial to have a powder material coating having a thickness much greater than the electrocoating in order to provide increased corrosion protection. Thus, the approaches adopted with the present teachings may include applying the second layer or coating 42 having a second thickness of from about 1.5 to about 10 times greater than the first thickness of the first coating 36. Accordingly, by way of example, in certain aspects a first primer coating 36 having a thickness of about 15 µm may be used with a second primer coating 42 having a thickness of from about 25 µm to about 150 µm.

In various aspects, the methods of the present teachings may include heating the workpiece or substrate having the first primer coating 36 to a temperature of from about 80° C. to about 100° C. prior to applying the second primer coating 42.

In one presently preferred aspect that can be used with magnesium workpieces having an epoxy resin first primer coating, the second primer coating may include a powder coating mainly containing a large portion of polyurethane. It may include, for example, a TIGER DRYLAC® powder coating "wet black" 049/80036, having a high gloss, commercially available from TIGER Coatings GmbH & Co, of Austria.

A variety of depositing methods may be employed to apply the metal compositions that form the metal layer or metal film 44 in the topcoat portion 40. One preferred method of depositing the metal film 44 onto the second primer coating 42 is with sputter deposition techniques. Sputter deposition is an ion-assisted, physical vapor deposition (PVD) technique of depositing thin films by sputtering. This typically involves ejecting material from a "target" that is a source onto a "substrate" such as the primer coating (e.g., second primer coating 42) on a workpiece. In certain aspects, the physical vapor deposition may be open air plasma assisted physical vapor deposition or ion beam assisted physical vapor deposition.

Preferred metals for the sputtered metal film 44 include those that impart a shiny metallic appearance, for example, chromium (Cr) or compounds of Cr, such as chromium nitride (CrN), and nickel (Ni) or compounds of Ni. As recognized by one of skill in the art, the metal film composition may comprise mixtures of the above identified metals, as well.

It is envisioned that various ion-assisted PVD apparatuses can be used to apply the metal film 44. One exemplary apparatus may include a deposition chamber and one or more electron guns for deposition of the metal film. As is known in the art, in certain aspects, the apparatus may be operated in an ultra-high vacuum. The substrate to be coated with the metal film may be first placed in a chamber and the pressure is lowered. A first crucible in the chamber may hold the metal to be deposited. If a combination of metals is to be deposited, a second metal may be held by a second crucible, which is deposited over the first layer, forming a second layer. Another option available may be to deposit a combination of metals simultaneously. Metals may be deposited on the second primer coating 42 at a rate of about 0.10 nm/s to a thickness of greater than about 1 nm and less than about 50 nm, which can observed by thickness monitors known in the art. The metal film 44 may have be deposited onto the second primer coating 42 at ultra-low thicknesses of less than about 50 nm, optionally less than about 40 nm, or in certain aspects, at about 25 nm to about 30 nm. In certain aspects, it may be possible to coat a very thin layer, for example, an ultra-thin layer on the order of from about 1 nm to about 20 nm, from about 5 nm to about 15 nm, or about 10 nm, still achieving good surface coverage, substantially uniform coverage, and good adhesion. Accordingly, the use of PVD allows the metal film 44 to be deposited on the second primer coating 42 substrate very smoothly, evenly, and in a thin layer.

Other suitable PVD methods may include magnetron sputtering, where a target (the second primer coating 42) is bombarded with a sputter gun in an argon ion atmosphere, while the substrate is charged. The sputter gun forms a plasma of metal particles and argon ions that transfer by momentum to coat the substrate. Still other methods of applying the metal film 44 may include electron beam evaporation, where the substrate is contained in a vacuum chamber (from between about $10^{-3}$ to $10^{-4}$ Torr or about $1.3 \times 10^{-1}$ Pa to $1.3 \times 10^{-2}$ Pa) and a metal evaporant is heated by a charged electron beam, where it evaporates and then condenses on the target substrate. The metal film 44 may also be applied by electroplating (e.g., electrolytic deposition), electroless deposition/plating, or pulse laser deposition. It is also envisioned that, depending on the material of the second primer coating layer, the metal film may also be applied by electroplating (e.g., electrolytic deposition), or pulse laser deposition.

In certain aspects, the methods of providing an enhanced surface coating on a light metal or alloy substrate may include the process and treatment discussed above, but may also include further identifying particularly corrosion prone or susceptible areas on the exposed substrate of the workpiece when it will be used in service and exposed to corrosive conditions. In certain aspects of the present disclosure, the methods for treating the light metal substrate may include designing a supporting rack having predetermined support regions that will contact the substrate at predetermined contact points. Such a support rack design can be particularly advantageous for use during the oxide layer formation process (forming pretreatment layer 34) on the exposed surface of the substrate. Thus, the support racks may be designed such that the support regions correspond to the least corrosion prone regions on the substrate where contact is established (at predetermined contact points or regions on the substrate). In such a variation, the contact points or regions on the substrate may not have as thick or full coverage of the protective coatings, including the oxide pretreatment layer 34. Thus, the potentially corrosion susceptible contact regions on the substrate will be relegated to the least corrosion prone areas.

Figure 4:
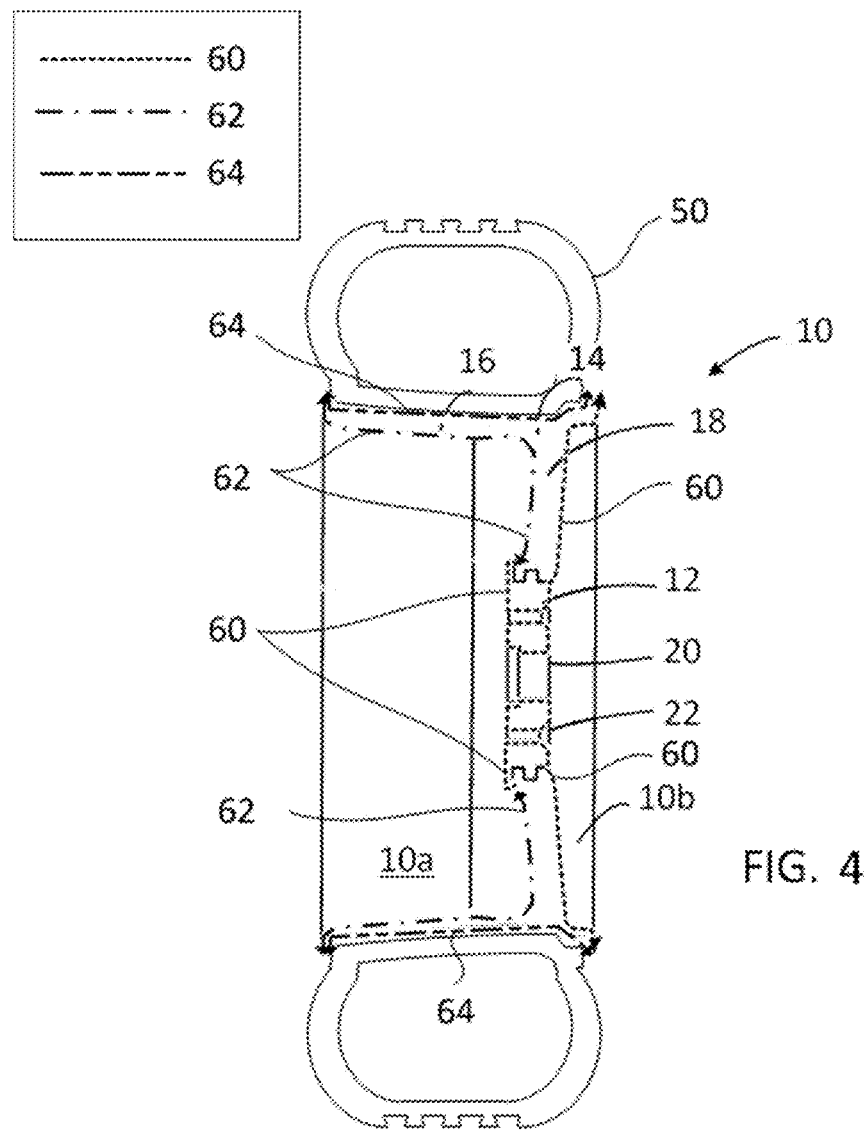
FIG. 4 is a cross-sectional view of the wheel assembly taken like that in FIG. 2, but further including a tire as part of the wheel assembly.

By way of example, FIG. 4 is another view of the wheel assembly in FIGS. 1 and 2, but also includes a tire 50 disposed around the wheel assembly along the rim 16 of the outer wheel portion 14 of wheel 10. The exposed surfaces of the light metal wheel 10 have distinct corrosion susceptibility and thus are designated with different outlines in FIG. 4. First surface regions 60 on the exposed surface or substrate of the wheel 10 have the greatest susceptibility to corrosion, because they are exposed on the outboard side 10b to an external corrosive environment and also have galvanic contact with distinct metals in other components in the wheel assembly 10. For example, the lug holes 22 may have lug nuts (not shown) formed of distinct metals, like steel in direct contact with the substrate. The combination of the highest exposure to corrosive agents and galvanic contact makes the first surface regions the most corrosion prone regions on the workpiece substrate of the wheel 10.

Second surface regions 62 are also susceptible to corrosion, but are disposed on the inboard side 10a and thus along a more protected back side of the wheel 10. Also, there is less galvanic contact exposure along second surface regions 62. Thus, the second surface regions 62 have less susceptibility to corrosion than first surface regions 60.

Lastly, wheel 10 defines third surface region(s) 64 defined along the rim 16 of the outer wheel portion 14 where the tire 50 is seated. The third surface region(s) 64 are the least corrosion prone regions on the wheel 10, having reduced exposure to the external environment and thus being protected from corrosive agents, as well as experiencing little or no galvanic contact. Thus, the third surface regions 64 of the wheel 10 have the least amount of susceptibility to corrosion as compared to the first surface regions 60 and the second surface regions 62.

During the formation process, especially during MAO and/or PEO processing techniques, the workpiece is arranged on an electrically conductive supporting rack and then exposed to electrolyte (e.g., by disposing or immersing the supporting rack and workpiece in an electrolyte bath). Electric potential or current is generated that flows from the electrically conductive supporting rack to the workpiece to facilitate formation of the pretreatment layer 34 in the electrolyte bath. However, the deposited oxide or other formed layers may be thinner or absent in regions where physical contact is established between the rack and the workpiece, as the contact point is not exposed to as much electrolyte and further forms part of the electric pathway between the workpiece and the rack (that serves as an electrode during the process).

Thus, in certain aspects, the methods of providing an enhanced surface coating on a light metal or alloy substrate includes selecting one or more regions of the workpiece substrate as contact points with the supporting rack, where the contact points have less risk of exposure to corrosive agents or galvanic conditions during service or use. Thus, in the example of the wheel assembly 10 of FIG. 4, the particularly corrosion prone or susceptible areas on the exposed substrate of the workpiece include the first surface regions 60 and the second surface regions 62. A supporting rack may thus be specially designed to have predetermined support regions that will contact or engage the predetermined support points on the substrate. Here, the predetermined support points may be the third surface regions 64 that have the least amount of susceptibility to corrosion and galvanic contact as compared to the first surface regions 60 and the second surface regions 62. It should be noted that in certain variations, the predetermined support points on the substrate or the workpiece may be selected to be on the regions with middle levels of corrosion susceptibility, for example, the second surface regions 62, where the level of exposure to a corrosive agents or galvanic conditions (with metals of differing galvanic potential) of these second surface regions 62 may be minimized. However, the regions with the highest risk for corrosion susceptibility (first surface regions 60) are not selected as contact points when designing the supporting rack.

Figure 5:
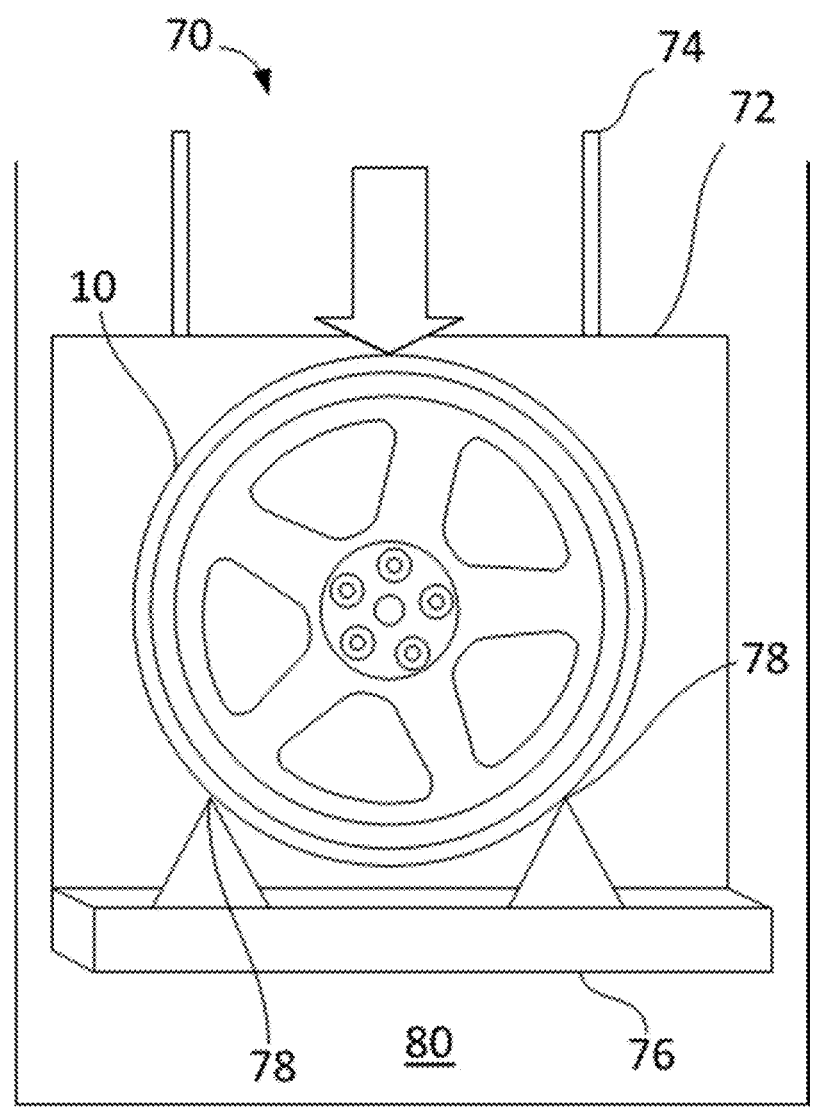
FIG. 5 is a schematic of a support rack for holding a lightweight metal wheel assembly during a coating process, such as micro-arc oxidation technique, where the contact points with the wheel workpiece are disposed on the least corrosion susceptible regions in accordance with certain aspects of the present disclosure.
Figure 6:
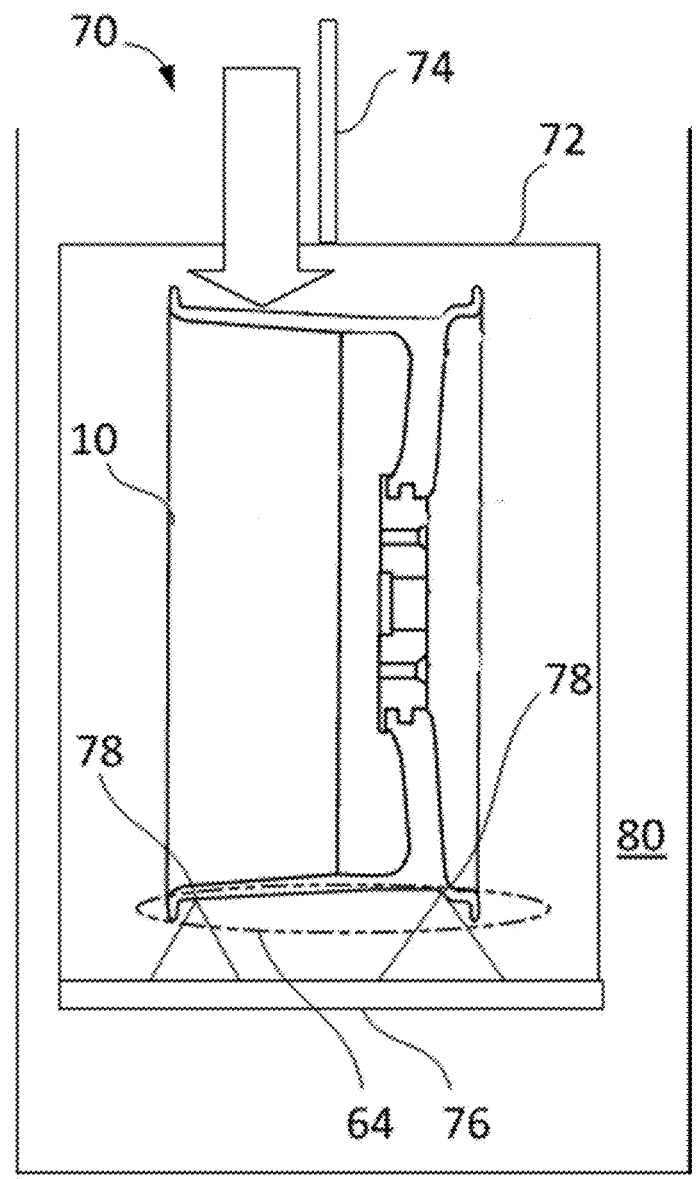
FIG. 6 is a side view of the support rack and lightweight metal wheel assembly in FIG. 5.

In FIGS. 5 and 6, such an exemplary and simplified tooling system is shown for purposes of illustration. For example, such tooling may include a support rack 70 that can be used in a process to create an enhanced surface coating on a light metal or alloy substrate. The tooling for an MAO process contains a conductive path to deliver electricity by one or several supporting points to hold the workpiece (e.g., in electrolyte). In FIGS. 5 and 6, the light metal or alloy workpiece with a substrate to be protected is the wheel 10. The support rack 70 has a conductive body 72 attached to extension members 74 and a lower support platform 76. The extension members 74 can be used to position the support rack 70 within an electrolyte bath 80. A plurality of supporting regions 78 are disposed on the lower support platform 76 for establishing contact and engaging with the wheel 10. In certain variations, the support rack 70 defines a plurality of supporting regions 78, and the substrate of the workpiece (wheel 10) is rested on the supporting rack 70 by aligning the supporting regions 78 with predetermined contact regions of the substrate (wheel 10). More specifically, the supporting regions 78 are designed to establish contact points corresponding to the third surface regions 64 (least corrosion prone regions) on the rim 16 of the outer wheel portion 14 of wheel 10. In certain variations, the wheel 10 is a magnesium wheel, and the predetermined contact regions are located on the outer rim 16 of the magnesium wheel.

The support rack 70 having the wheel 10 disposed thereon may be immersed in or otherwise brought into contact with the electrolyte bath 80. In certain variations, the support rack 70 is an independent component that is removable from the electrolyte bath 80, as shown in FIGS. 5 and 6. In other variations, the support rack 70 is integral with a structure containing the electrolyte bath (not shown). The support rack 70 may be formed of an electrically conductive material and thus serve as a working electrode when potential is applied (while in contact with the electrolyte and workpiece). For example, the support rack 70 may serve as a conductive cathode during at least one of a micro-arc oxidation process and a plasma electrolytic oxidation process. The arrows in FIGS. 5 and 6 show the path of electricity through the workpiece wheel 10.

Figure 7:
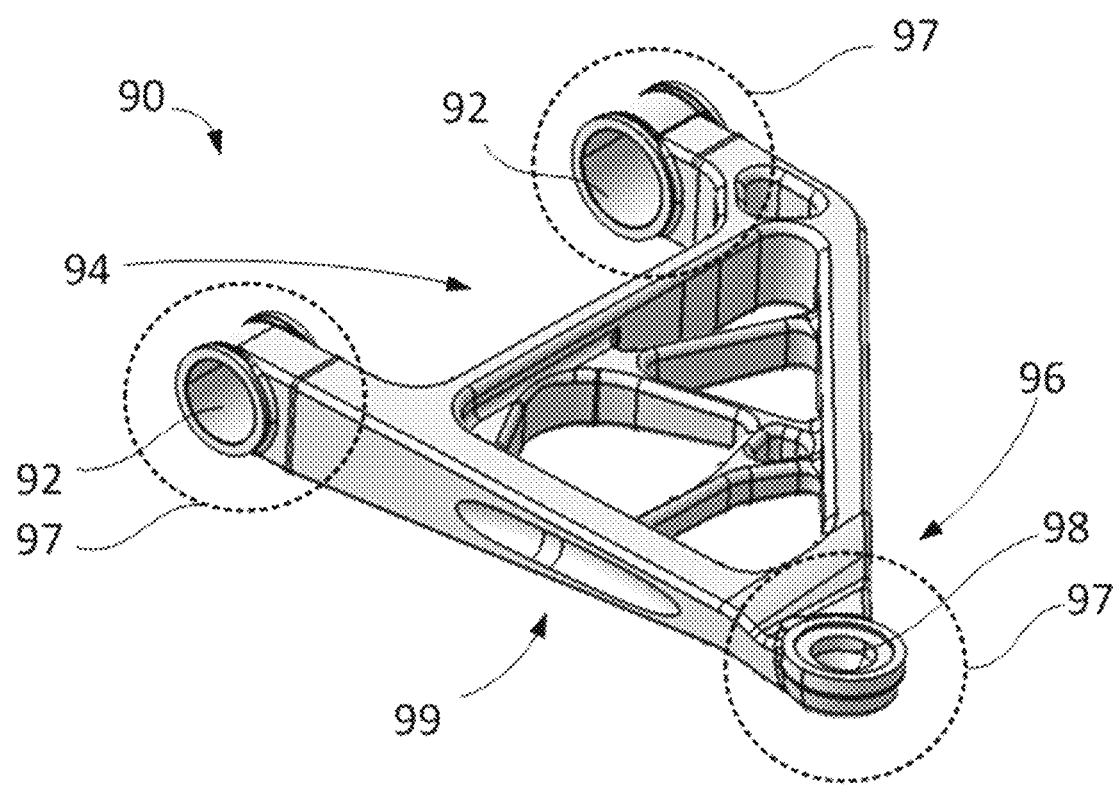
FIG. 7 is a lightweight metal control arm that can be coated in accordance with certain aspects of the present disclosure for enhanced corrosion protection.

In other variations, the methods of the present disclosure create an enhanced corrosion protection surface coating on a metal or alloy substrate like any of those discussed previously above, where the substrate is a control arm suspension component as shown in FIG. 7. Motor vehicles having steerable wheels have wheel axles supported on swivel members, which are retained between upper and lower control arms (also known as A-arms or wishbones). One such exemplary control arm 90 is attached to a body or frame rail of a vehicle by attachment brackets (not shown) that receive mounting bolts therethrough. Thus, a control arm 90 has a plurality of connection points with other adjacent componentry. For example, one type of connection point is where mounting bolts (not shown) pass through a plurality of bushings 92 at lateral end 94 of the control arm 90 to provide the ability to pivot the control arm 90 (e.g., on the vehicle body or frame rail). Another connection point is on a distal end 96 opposite to the lateral end 94 that is used to connect to and support a swivel member (not shown) via joint 98 for retaining a wheel. Control arm 90 may be formed of a light metal or metal alloy, such as magnesium. The bushings 92 and the joint 98 are thus connection points in contact with other metals and thus different galvanic potentials, which define fourth surface regions 97, that are of higher risk for corrosion. Further, a bottom side 99 of the control arm 90 may be exposed to an external environment and thus corrosive agents.

In such a variation, a supporting rack may thus be specially designed to have predetermined support regions that will contact or engage the predetermined support points on the control arm substrate. Here, the predetermined support points may be any regions outside the connection points corresponding to the fourth surface regions 97 or the bottom side 99 of the control arm 90.

Figure 8:
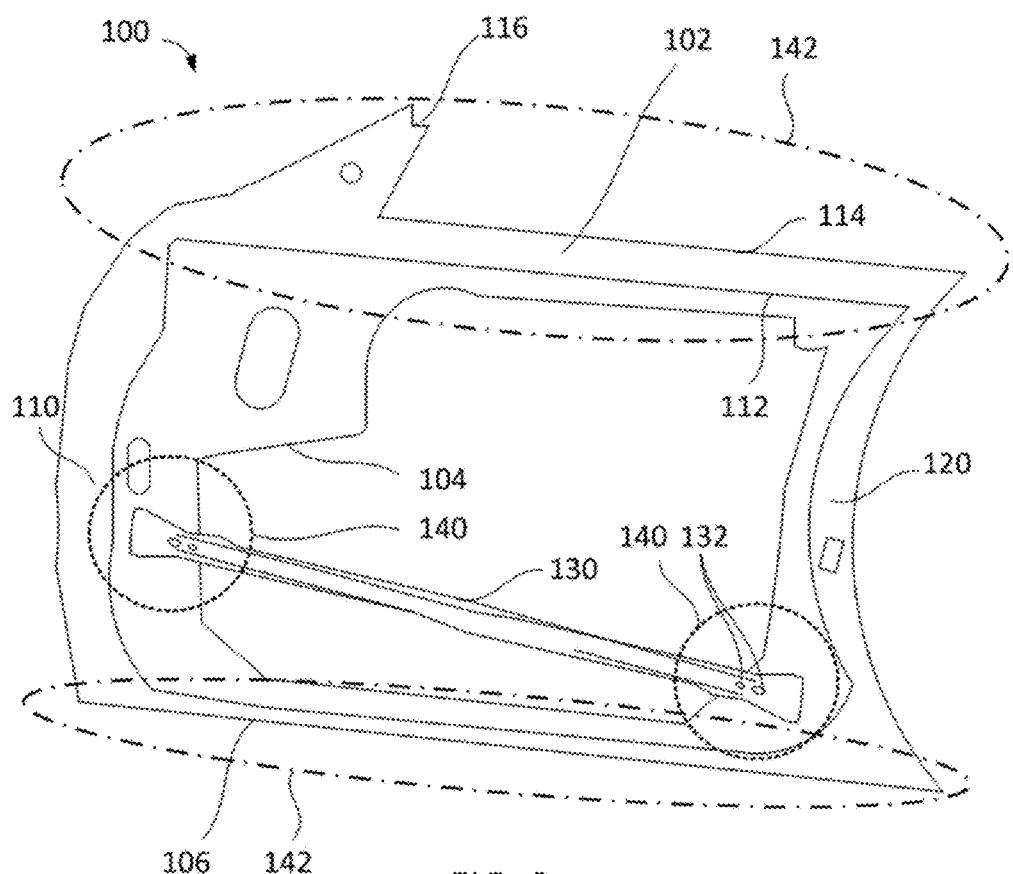
FIG. 8 is a lightweight metal door panel that can be coated in accordance with certain aspects of the present disclosure for enhanced corrosion protection.

In other variations, the methods of the present disclosure create an enhanced surface coating on a metal or alloy substrate like any of those discussed above, where the substrate is a component in a lightweight automotive door assembly 100. Referring to FIG. 8, an inner door panel 102 is shown before various hardware and other componentry is installed on the door envelope to form the door assembly. The door panel 102 may be formed of a lightweight metal such as magnesium, aluminum, or alloys thereof. The door panel 102 includes an inner region 104 defining a lower section 106 connected with a front hinge pillar 110. The door panel 102 may also have an inner beltline 112 and optionally an outer beltline 114. A mirror mount 116 may be connected with the inner beltline 112.

A rear pillar 120 is disposed on a second side of the inner door panel 102 opposite to the front hinge pillar 110, where a latch mount may be disposed (not shown). Extending between the front hinge pillar 110 and the rear pillar 120 is a side intrusion beam 130. The side intrusion beam 130 may be fabricated from a different metal than the inner door panel 102 (e.g., from steel) and is mounted or attached thereto, for example, by fasteners 132. Thus, fifth surface regions 140 are defined where the door panel 102 may contact other metal components and thus are at higher risk for galvanic reaction and corrosion, for example, where the door panel 102 contacts the side intrusion beam 130.

Sixth surface regions 142 are shown along the lower section 106 of door panel 102 and regions corresponding to the inner beltine 112 and outer beltine 114, where the door panel may be exposed to corrosive conditions. Thus, for methods of forming a protective coating over the door, a supporting rack may thus be specially designed to have predetermined support regions that will contact or engage predetermined support points on the door panel substrate. Here, the predetermined support points may be those on the door panel 102 that are outside either the fifth surface regions 140 or the sixth surface regions 142. Thus, the enhanced surface coating is formed on the least corrosion prone regions of the door panel 102.

As will be appreciated by those of skill in the art, the present methods may be used to enhance corrosion protection for a variety of lightweight metal components and are not limited to merely those exemplary embodiments described above.

Thus, in certain other aspects, the present teachings include a method of providing an enhanced surface coating on a metal or alloy substrate of a workpiece. The method comprises providing a metal or alloy substrate having an exposed surface. Such a method may comprise identifying corrosion prone areas of the exposed substrate. The metal or alloy substrate is disposed on a supporting rack member. Thus, the method may include aligning one or more support regions of the supporting rack member with predetermined contact regions of the substrate, where the predetermined contact regions are outside of the corrosion prone areas (thus, avoiding contact of the support member of the supporting rack member with the corrosion prone areas of the substrate). A corrosion resistance basecoat may be formed onto at least a portion of the exposed surface. The corrosion resistance basecoat may be formed by generating an oxide layer on the exposed surface of the substrate and applying a first primer coating onto the oxide layer. The oxide layer may be generated on the exposed surface of the substrate by immersing the substrate in an electrolyte bath while resting on the support members of the supporting rack member. The generating of the oxide layer on the exposed surface of the substrate may use at least one of a micro-arc oxidation and a plasma electrolytic oxidation process. The supporting rack member may be configured to serve as a conductive electrode, such as a working electrode/cathode, during at least one of a micro-arc oxidation process and a plasma electrolytic oxidation process.

In certain variations, the supporting rack member is an independent component, removable from the electrolyte bath. In other variations, the supporting rack member is integral with a structure containing the electrolyte bath. The substrate may comprise a magnesium wheel and the predetermined contact regions are located on an outer rim or other low corrosion susceptible area of the magnesium wheel. In certain other variations, the substrate comprises a magnesium control arm suspension component and the predetermined contact regions are located outside of the control arm connection points or lower/bottom surface. In yet other variations, the substrate comprises a magnesium door component and the predetermined contact regions are located outside of the upper and lower edges of the door and connection points with the intrusion beam or other metal components in the door assembly.

The protective coating is formed in accordance with the embodiments and methods described previously above. Thus, the protective topcoat is formed onto at least a portion of the corrosion resistance basecoat. The method of forming the protective topcoat may include applying a second primer coating onto at least a portion of the first primer coating and depositing a sputtered metallic film onto the second primer coating using a physical vapor deposition technique. The sputtered metallic film may be deposited having a thickness of from about 5 nm to about 15 nm. The method may further include applying a clear coat layer over at least a portion of the metallic film. In various aspects, each of the first primer coating and the second primer coating comprises at least one of an electrostatic coating and a powder material coating.

It should be understood that the present technology is not dependent on, nor limited to, any particular type of material or production method, and the materials and methods may be varied as desired, based on the intended results. The light metal and alloys provided with the enhanced surface protection coatings disclosed herein have been shown to have superior adhesion qualities, resistance to chipping, resistance to thermal shock, and minimal scratch corrosion.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A light metal workpiece with enhanced surface protection, comprising:
   a light metal alloy or matrix having an exposed surface;
   a corrosion resistance basecoat applied onto at least a portion of the exposed surface, the corrosion resistance basecoat including:
      a pretreatment layer comprising an oxide layer having a thickness of from about 5 μm to about 20 μm and an average pore size of from about 0.1 μm to about 5 μm; and
      a first primer coating applied onto the pretreatment layer comprising at least one of an electrostatic coating and a powder material coating;
   a protective topcoat applied onto at least a portion of the corrosion resistance basecoat, the protective topcoat including:
      a second primer coating applied onto the first primer coating comprising at least one of an electrostatic coating and a powder material coating;
      a sputtered metallic film applied onto at least a portion of the second primer coating using a physical vapor deposition technique having a thickness of from about 5 nm to about 15 nm; and
   a clear coat layer applied onto at least a portion of the metallic film.

2. The light metal workpiece of claim 1, wherein the light metal alloy or matrix comprises magnesium, and the oxide layer comprises a magnesium oxide ceramic.

3. The light metal workpiece of claim 1, wherein the oxide layer is formed having a thickness of from about 5 μm to about 20 μm, the first primer coating is applied having a thickness of from about 50 μm to about 150 μm, the second primer coating is applied having a thickness of from about 50 μm to about 150 μm, and the clear coat layer is applied having a thickness of from about 20 μm to about 30 μm.

4. The light metal workpiece of claim 1, wherein the light metal or alloy matrix comprises at least one valve metal selected from the group consisting of aluminum, magnesium, titanium, and mixtures thereof.

5. The light metal workpiece of claim 1, wherein the first primer coating and the second primer coating comprise the same material.

6. A magnesium metal wheel, comprising:
   a magnesium metal matrix having an exposed surface;
   a magnesium oxide ceramic layer formed on at least a portion of the exposed surface having a thickness of from about 5 μm to about 20 μm and an average pore size of from about 0.1 μm to about 5 μm;
   a first primer coating applied onto at least a portion of the magnesium oxide ceramic layer having a thickness of from about 50 μm to about 150 μm;
   a second primer coating applied onto at least a portion of the first primer coating the second primer coating having a thickness of from about 50 μm to about 150 μm;
   a sputtered metallic film deposited onto at least a portion of the second primer coating using a physical vapor deposition technique, the sputtered metallic film having a thickness of from about 5 nm to about 15 nm; and
   a clear coat layer applied onto at least a portion of the metallic film having a thickness of from about 20 μm to about 30 μm.

7. The magnesium metal wheel of claim 6, wherein each of the first primer coating and the second primer coating comprises at least one of an electrostatic coating and a powder material coating.

8. A method of providing an enhanced surface coating on a metal or alloy substrate, the method comprising:

forming a corrosion resistance basecoat onto at least a portion of an exposed surface of a light metal or alloy substrate, including:

generating an oxide layer on the exposed surface of the substrate by immersing the substrate in an electrolyte bath and resting the substrate on a supporting rack member, wherein the generating of the oxide layer comprises at least one of micro-arc oxidation process and a plasma electrolytic oxidation process and the supporting rack member is configured to serve as a conductive cathode during at least one of the micro-arc oxidation process or the plasma electrolytic oxidation process; and applying a first primer coating onto the oxide layer;

forming a protective topcoat onto at least a portion of the basecoat, including:

applying a second primer coating onto the first primer coating;

depositing a sputtered metallic film onto the second primer coating using a physical vapor deposition technique; and applying a clear coat layer onto at least a portion of the sputtered metallic film.

9. The method of claim 8, wherein the substrate comprises magnesium, and generating the oxide layer comprises generating a magnesium oxide ceramic.

10. The method of claim 8, wherein generating the oxide layer on the exposed surface of the substrate comprises using at least one of a micro-arc oxidation and a plasma electrolytic oxidation process.

11. The method of claim 8, wherein the supporting rack member is an independent component, removable from the electrolyte bath.

12. The method of claim 8, wherein the supporting rack member is integral with a structure containing the electrolyte bath.

13. The method of claim 8, further comprising identifying corrosion prone areas of the exposed surface, wherein the supporting rack member defines a plurality of support regions, and the resting of the substrate on the supporting rack member comprises aligning the support regions with predetermined contact regions of the substrate while avoiding contact with the corrosion prone areas.

14. The method of claim 13, wherein the substrate comprises a magnesium wheel, and the predetermined contact regions are located on an outer rim of the magnesium wheel.

15. The method of claim 13, wherein the substrate comprises a magnesium control arm suspension component or a magnesium door component.

* * * * *